(12) United States Patent
Park et al.

(10) Patent No.: US 6,984,847 B2
(45) Date of Patent: Jan. 10, 2006

(54) DUAL PANEL TYPE ORGANIC ELECTROLUMINESCENT DEVICE AND METHOD OF FABRICATING THE SAME

(75) Inventors: Jae-Yong Park, Gyeonggi-do (KR); Kwang-Jo Hwang, Gyeonggi-do (KR)

(73) Assignee: LG.Philips LCD Co., Ltd., (KR)

( * ) Notice: Subject to any disclaimer, the term of this patent is extended or adjusted under 35 U.S.C. 154(b) by 50 days.

(21) Appl. No.: 10/741,440

(22) Filed: Dec. 22, 2003

(65) Prior Publication Data

US 2004/0129936 A1 Jul. 8, 2004

(30) Foreign Application Priority Data

Dec. 26, 2002 (KR) ...................... 10-2002-0084579

(51) Int. Cl.
*H01L 35/24* (2006.01)
(52) U.S. Cl. ........................... 257/40; 257/55; 257/56; 257/59; 257/66; 257/349
(58) Field of Classification Search ................. 257/55, 257/56, 59, 66, 349
See application file for complete search history.

(56) References Cited

U.S. PATENT DOCUMENTS

| | | | |
|---|---|---|---|
| 6,175,345 B1 | 1/2001 | Kuribayashi et al. | |
| 6,492,659 B1 * | 12/2002 | Yamazaki et al. | ............ 257/59 |
| 6,548,961 B2 | 4/2003 | Barth et al. | |
| 2002/0024096 A1 | 2/2002 | Yamazaki et al. | |
| 2002/0050795 A1 | 5/2002 | Imura | |

| | | |
|---|---|---|
| 2002/0158577 A1 | 10/2002 | Shimoda et al. |

(Continued)

FOREIGN PATENT DOCUMENTS

EP    1 220 187    7/2002

(Continued)

*Primary Examiner*—Mai-Huong Tran
(74) *Attorney, Agent, or Firm*—Morgan Lewis & Bockius LLP

(57) ABSTRACT

An organic electroluminescent device includes first and second substrates facing and spaced apart from each other; a gate line on an inner surface of the first substrate; a semiconductor layer over the gate line, the semiconductor layer overlying a surface of the first substrate; a data line crossing the gate line; a data ohmic contact layer under the data line, the data ohmic contact layer having the same shape as the data line; a power line parallel to, or substantially parallel to, and spaced apart from the data line, the power line including the same material as the gate line; a switching thin film transistor connected to the gate line and the data line, the switching thin film transistor using the semiconductor layer as a switching active layer; a driving thin film transistor connected to the switching thin film transistor and the power line, the driving thin film transistor using the semiconductor layer as a driving active layer; a connection pattern connected to the driving thin film transistor, the connection pattern including a conductive polymeric material; a first electrode on an inner surface of the second substrate; an organic electroluminescent layer on the first electrode; and a second electrode on the organic electroluminescent layer, the second electrode contacting the connection pattern.

15 Claims, 18 Drawing Sheets

U.S. PATENT DOCUMENTS

| | | |
|---|---|---|
| 2002/0167280 A1 | 11/2002 | Hayashi et al. |
| 2003/0201445 A1 | 10/2003 | Park et al. .................... 257/79 |
| 2003/0205763 A1 | 11/2003 | Park et al. .................. 257/359 |

FOREIGN PATENT DOCUMENTS

| | | |
|---|---|---|
| JP | 04-280231 | 6/1992 |
| JP | 2001-117509 | 4/2001 |
| JP | 2001-177509 | 4/2001 |
| JP | 2002-261291 | 9/2002 |
| KR | 2002-0047889 | 6/2002 |
| KR | 2004-0079476 | 9/2004 |
| WO | WO-02/078101 | 10/2005 |

* cited by examiner

Emission Direction

DUAL PANEL TYPE ORGANIC ELECTROLUMINESCENT DEVICE AND METHOD OF FABRICATING THE SAME

The present invention claims the benefit of the Korean Patent Application No. 2002-84579 filed in Korea on Dec. 26, 2002, which is hereby incorporated by reference.

BACKGROUND OF THE INVENTION

1. Field of the Invention

The present invention relates to an organic electroluminescent device, and more particularly, to a dual panel type organic electroluminescent device that has a reduced number of masks in its fabricating process, and a fabricating method thereof.

2. Discussion of the Related Art

Among flat panel displays (FPDs), organic electroluminescent (EL) devices have been of particular interest in research and development because they are light-emitting type displays that have a wide viewing angle as well as a desirable contrast ratio, as compared with liquid crystal display (LCD) devices. Since a backlight need not be provided in conjunction with such organic EL devices, their size and weight is small, as compared to other types of display devices. The organic EL devices have other desirable characteristics, such as low power consumption, superior brightness and fast response time. When driving the organic EL devices, only a low direct current (DC) voltage is required. Moreover, a rapid response speed can be obtained. It is understood in this field that because the organic EL devices are entirely formed in a solid phase arrangement, unlike LCD devices, they are sufficiently strong to withstand external impacts and also have a greater operational temperature range. Moreover, because fabricating an organic EL device is a relatively simple process with few processing steps, it is much cheaper to produce an organic EL device when compared with LCD devices or plasma display panels (PDPs). In particular, only deposition and encapsulation apparatuses are necessary for manufacturing the organic EL devices.

In an active matrix organic EL device, a voltage applied to the pixel and a charge for maintaining the voltage is stored in a storage capacitor. This allows for a constant voltage driving the device until a voltage of next frame is applied, regardless of the number of the scanning lines. As a result, since an equivalent brightness is obtained with a low applied current, an active matrix organic EL device of low power consumption, high resolution and large area may be made.

FIG. 1 is an equivalent circuit diagram showing a basic pixel structure of an active matrix organic electroluminescent device according to the related art. In FIG. 1, a scanning line 2 is arranged in a first direction, and a signal line 4 and a power line 6 are arranged in a second direction perpendicular to the first direction, thereby defining a pixel region "P." The signal line 4 and the power line 6 are spaced apart from each other. A switching thin film transistor (TFT) "$T_S$," an addressing element, is connected to the scanning line 2 and the signal line 4, and a storage capacitor "$C_{ST}$" is connected to the switching TFT "$T_S$" and the power line 6. A driving TFT "$T_D$," a current source element, is connected to the storage capacitor "$C_{ST}$" and the power line 6, and an organic electroluminescent (EL) diode "$D_{EL}$" is connected to the driving TFT "$T_D$." The organic EL diode "$D_{EL}$" has an organic EL layer (not shown) between an anode and a cathode. The switching TFT "$T_S$" adjusts a voltage applied to the driving TFT "$T_D$" and the storage capacitor "$C_{ST}$" stores a charge to maintain the voltage applied to the driving TFT "$T_D$".

When a scan signal of the scanning line 2 is applied to a switching gate electrode of the switching TFT "$T_S$," the switching TFT "$T_S$" is turned ON, and an image signal of the signal line 4 is applied to a driving gate electrode of the driving TFT "$T_D$" and the storage capacitor "$C_{ST}$" through the switching element "$T_S$." As a result, the driving TFT "$T_D$" is turned ON. When the driving TFT "$T_D$" is turned ON, a current of the power line 6 is applied to the organic EL diode "$D_{EL}$" through the driving TFT "$T_D$." As a result, light is emitted. The current density of the driving element "$T_D$" is modulated by the image signal applied to the driving gate electrode. As a result, the organic electroluminescent diode "$D_{EL}$" can display images having multiple levels of gray scale. Moreover, since the voltage of the image signal stored in the storage capacitor "$C_{ST}$" is applied to the driving gate electrode, the current density flowing into the organic electroluminescent diode "$D_{EL}$" can be maintained at a uniform level until the next image signal is applied even when the switching element "$T_S$" is turned OFF.

FIG. 2 is a schematic plane view of an organic electroluminescent device according to the related art.

In FIG. 2, a gate line 37 crosses a data line 51 and a power line 42, which are spaced apart from each other. A pixel region "P" is defined between the gate line 37, the data line 51 and the power line 42. A switching thin film transistor (TFT) "$T_S$" is disposed adjacent to the crossing of the gate line 37 and the data line 51. A driving TFT "$T_D$" is connected to the switching TFT "$T_S$" and the power line 42. A storage capacitor "$C_{ST}$" uses a portion of the power line 42 as a first capacitor electrode and an active pattern 34 extending from a switching active layer 31 of the switching TFT "$T_S$" as a second capacitor electrode. A first electrode 58 is connected to the driving TFT "$T_D$," and an organic electroluminescent (EL) layer (not shown) and a second electrode (not shown) are sequentially formed on the first electrode 58. The first and second electrodes and the organic EL layer interposed therebetween constitute an organic EL diode "$D_{EL}$."

FIG. 3 is a schematic cross-sectional view taken along a line "III—III" of FIG. 2. In FIG. 3, a driving thin film transistor (TFT) "$T_D$" including an active layer 32, a gate electrode 38 and source and drain electrodes 50 and 52 is formed on a substrate 1. The source electrode 50 is connected to a power line 42 and the drain electrode 52 is connected to a first electrode 58. An active pattern 34 made of the same material as the active layer 32 is formed under the power line 42 with an insulating layer 40 interposed therebetween. The active pattern 34 and the power line 42 constitute a storage capacitor "$C_{ST}$." An organic electroluminescent (EL) layer 64 and a second electrode 66 are sequentially formed on the first electrode 58 and constitute an organic EL diode "$D_{EL}$."

For insulating layers, a first insulating layer 30, for example, a buffer layer, is formed between the substrate 1 and the active layer 32. A second insulating layer 36 is formed between the active layer 32 and the gate electrode 38. A third insulating layer 40 is formed between the active pattern 34 and the power line 42. A fourth insulating layer 44 is formed between the power line 42 and the source electrode 50. A fifth insulating layer 54 is formed between the drain electrode 52 and the first electrode 58. A sixth insulating layer 60 is formed between the first electrode 58 and the organic EL layer 64. The third to sixth insulating layers 40, 44, 54 and 60 include contact holes which allow for connections to be made.

FIGS. 4A to 4I are schematic cross-sectional views showing a fabricating process of an organic electroluminescent device according to the related art. In FIG. 4A, a first insulating layer 30, for example a buffer layer, is formed on a substrate 1 by depositing a first insulating material. After forming a polycrystalline silicon layer (not shown) on the first insulating layer 30, an active layer 32 and an active pattern 34 are formed using a first mask process. In FIG. 4B, after sequentially depositing a second insulating material and a first metallic material on an entire surface of the substrate 1, a second insulating layer 36, such as a gate insulating layer, and a gate electrode 38 are formed using a second mask process. In FIG. 4C, a third insulating layer 40 is formed on the gate electrode 38 by depositing a third insulating material. After depositing a second metallic material on the third insulating layer 40, a power line 42 is formed over the active pattern 34 using a third mask process.

In FIG. 4D, after depositing a fourth insulating material on the power line 42, a fourth insulating layer 44 having first to third contact holes 46a, 46b and 48 is formed using a fourth mask process. The active layer 32 can be divided into a channel region 32a, and source and drain regions 32b and 32c by a subsequent doping process. The first and second contact holes 46a and 46b expose the source and drain regions 32b and 32c, respectively. The third contact hole 48 exposes the power line 42. The source and drain regions 32b and 32c are doped with impurities.

In FIG. 4E, after depositing a third metallic material on the fourth insulating layer 44, source and drain electrodes 50 and 52 are formed using a fifth mask process. The source electrode 50 is connected to the power line 42 through the third contact hole 48 (of FIG. 4D) and to the source region 32b through the first contact hole 46a (of FIG. 4D). The drain electrode 52 is connected to the drain region 32c through the second contact hole 46b (of FIG. 4D). The active layer 32, the gate electrode 38 and source and drain electrodes 50 and 52 constitute a driving thin film transistor (TFT) "$T_D$." The power line 42 and the active pattern 34 are connected to the source electrode 50 and an active layer of a switching TFT (not shown), respectively. In addition, the power line 42 and the active pattern 34 having the third insulating layer 40 interposed therebetween constitute a storage capacitor "$C_{ST}$".

In FIG. 4F, after depositing a fifth insulating material on the source and drain electrodes 50 and 52, a fifth insulating layer 54 having a fourth contact hole 56 is formed using a sixth mask process. The fourth contact hole 56 exposes the drain electrode 52.

In FIG. 4G, after depositing a fourth metallic material on the fifth insulating layer 54, a first electrode 58 is formed using a seventh mask process. The first electrode 58 is connected to the drain electrode 52 through the fourth contact hole 56 (of FIG. 4F).

In FIG. 4H, after depositing a sixth insulating material on the first electrode 58, a sixth insulating layer 60 having an open portion 62 is formed using an eighth mask process. The open portion 62 exposes the first electrode 58. The sixth insulating layer 60 protects the driving TFT "$T_D$" from moisture and contamination.

In FIG. 4I, an organic electroluminescent (EL) layer 64 and a second electrode 66 of a fifth metallic material are sequentially formed on the sixth insulating layer 60. The organic EL layer 64 contacts the first electrode 58 through the open portion 62 (of FIG. 4H). The second electrode 66 is formed on an entire surface of the substrate 1. The first electrode 58 is designed as an anode. For example, the fifth metallic material can be selected to have high reflectance and low work function because the second electrode 66 should reflect light emitted from the organic EL layer 64 and provide electrons to the organic EL layer 64.

FIG. 5 is a schematic cross-sectional view of an organic electroluminescent device according to the related art. In FIG. 5, first and second substrates 70 and 90, which have inner surfaces facing each other and are spaced apart from each other, have a plurality of pixel regions "P." An array layer 80 including a driving thin film transistor (TFT) "$T_D$" in each pixel region "P" is formed on an inner surface of the first substrate 70. A first electrode 72 connected to the driving TFT "$T_D$" is formed on the array layer 80 in each pixel region "P." Red, green and blue organic electroluminescent (EL) layers 74 are alternately formed on the first electrode 72. A second electrode 76 is formed on the organic EL layer 74. The first and second electrodes 72 and 76, and the organic EL layer 74 interposed therebetween constitute an organic EL diode "$D_{EL}$." The organic EL device is a bottom type where light is emitted from the organic EL layer 74 through the first electrode 72 and out of the first substrate 70.

The second substrate 90 is used as an encapsulation substrate. The second substrate 90 has a concave portion 92 at its inner center and the concave portion 92 is filled with a moisture absorbent desiccant 94 that removes moisture and oxygen to protect the organic EL diode "$D_{EL}$." The inner surface of the second substrate 90 is spaced apart from the second electrode 76. The first and second substrates 70 and 90 are attached with a sealant 85 at a peripheral portion of the first and second substrates.

In an organic ELD according to the related art, a TFT array part and an organic electroluminescent (EL) diode are formed over a first substrate, and an additional second substrate is attached with the first substrate for encapsulation. However, when the TFT array part and the organic EL diode are formed on one substrate in this way, production yield of the organic ELD is determined by a multiplication of the TFT's yield together with the organic EL diode's yield. Since the organic EL diode's yield is relatively low, the production yield of the overall ELD becomes limited by the organic EL diode's yield. For example, even when a TFT is well fabricated, an organic ELD using a thin film of about 1000 Å thickness can be judged as bad due to the defects of an organic emission layer. This results in loss of materials and increased production costs.

In general, organic ELDs are classified into bottom emission types and top emission types according to an emission direction of light used for displaying images via the organic ELDs. Bottom emission type organic ELDs have the advantages of high encapsulation stability and high process flexibility. However, the bottom emission type organic ELDs are ineffective for high resolution devices because they have poor aperture ratios. In contrast, top emission organic ELDs have a higher expected life span because they are more easily designed and they have a high aperture ratio. However, in top emission type organic ELDs, the cathode is generally formed on an organic emission layer. As a result, transmittance and optical efficiency of a top emission type organic ELDs are reduced because of a limited number of materials that may be selected. If a thin film-type passivation layer is formed to prevent a reduction of the light transmittance, the thin film-type passivation layer may fail to prevent infiltration of exterior air into the device.

SUMMARY OF THE INVENTION

Accordingly, the present invention is directed to an organic electroluminescent device and a method of fabricating the same that substantially obviate one or more of the problems due to limitations and disadvantages of the related art.

An object of the present invention is to provide an organic electroluminescent device having an improved production yield, a high resolution and a high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates facing and spaced apart from each other; a gate line on an inner surface of the first substrate; a semiconductor layer over the gate line, the semiconductor layer overlying a surface of the first substrate; a data line crossing the gate line; a data ohmic contact layer under the data line, the data ohmic contact layer having the same shape as the data line; a power line parallel to, or substantially parallel to, and spaced apart from the data line, the power line including the same material as the gate line; a switching thin film transistor connected to the gate line and the data line, the switching thin film transistor using the semiconductor layer as a switching active layer; a driving thin film transistor connected to the switching thin film transistor and the power line, the driving thin film transistor using the semiconductor layer as a driving active layer; a connection pattern connected to the driving thin film transistor, the connection pattern including a conductive polymeric material; a first electrode on an inner surface of the second substrate; an organic electroluminescent layer on the first electrode; and a second electrode on the organic electroluminescent layer, the second electrode contacting the connection pattern.

In another aspect, a method of fabricating an organic electroluminescent device includes forming a driving gate electrode, a gate line, and a power line on a first substrate using a first mask process; forming a first insulating layer and a semiconductor layer sequentially on the driving gate electrode, the gate line, and the power line; forming a first layer of silicon and a second layer of metal sequentially on the semiconductor layer; patterning the first and second layers sequentially using a second mask process to form a driving ohmic contact layer, a data ohmic contact layer, driving source and drain electrodes, and a data line, the driving ohmic contact layer being formed under the driving source and drain electrodes, the data ohmic contact layer being formed under the data line; forming a second insulating layer having a source contact hole and a drain contact hole on the driving source and drain electrodes and the data line using a third mask process, the source contact hole exposing the driving source electrode, and the drain contact hole exposing the driving drain electrode; forming a connection pattern and a connection electrode of conductive polymeric material on the second insulating layer, the connection pattern being connected to the driving drain electrode through the drain contact hole, and the connection electrode being connected to the driving source electrode through the source contact hole; forming a first electrode on a second substrate; forming an organic electroluminescent layer on the first electrode; forming a second electrode on the organic electroluminescent layer; and attaching the first and second substrates such that the second electrode contacts the connection pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the preferred embodiments of the present invention, examples of which are illustrated in the accompanying drawings.

Figure 1:
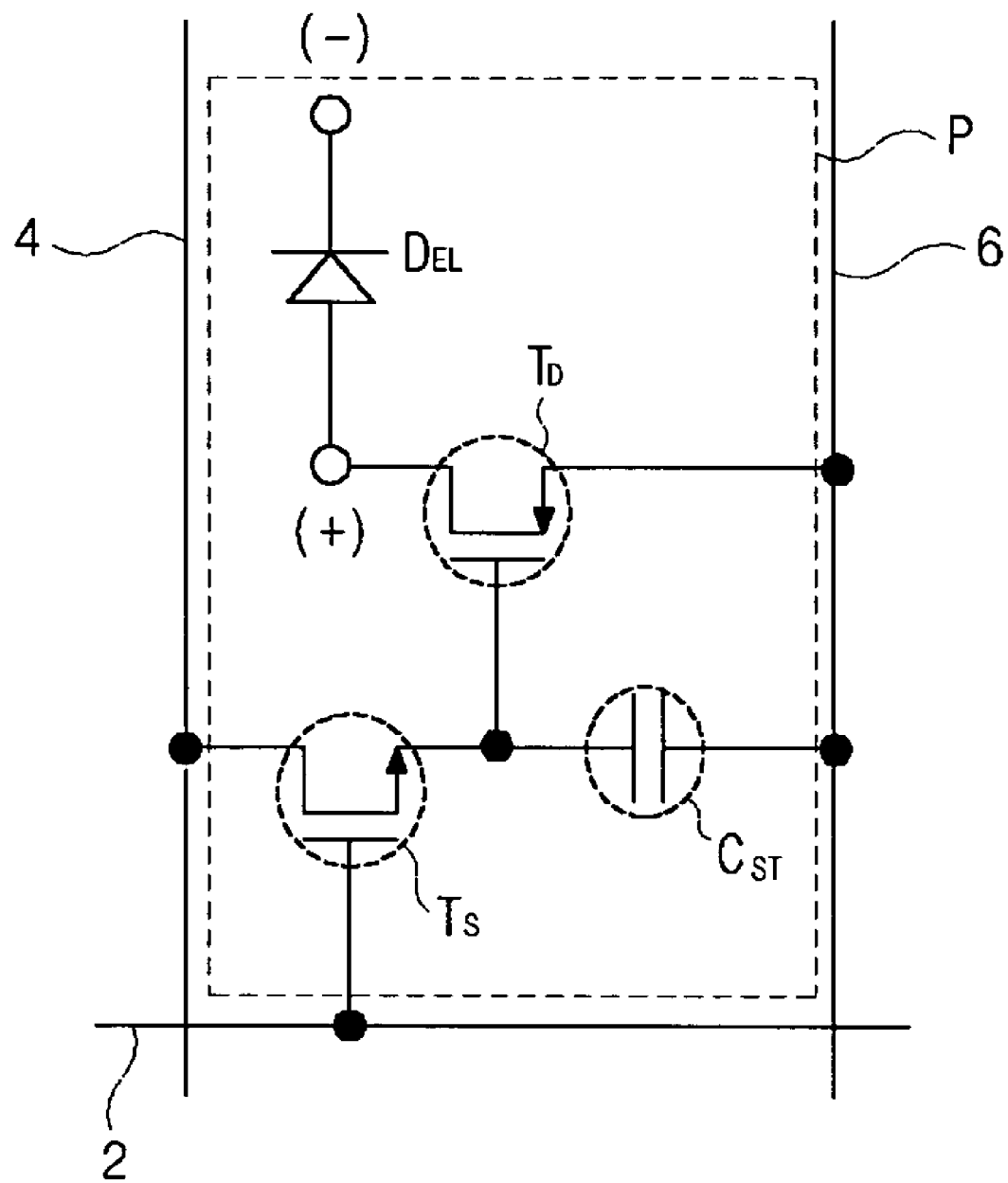
FIG. 1 is an equivalent circuit diagram showing a basic pixel structure of an active matrix organic electroluminescent device according to the related art.
Figure 2:
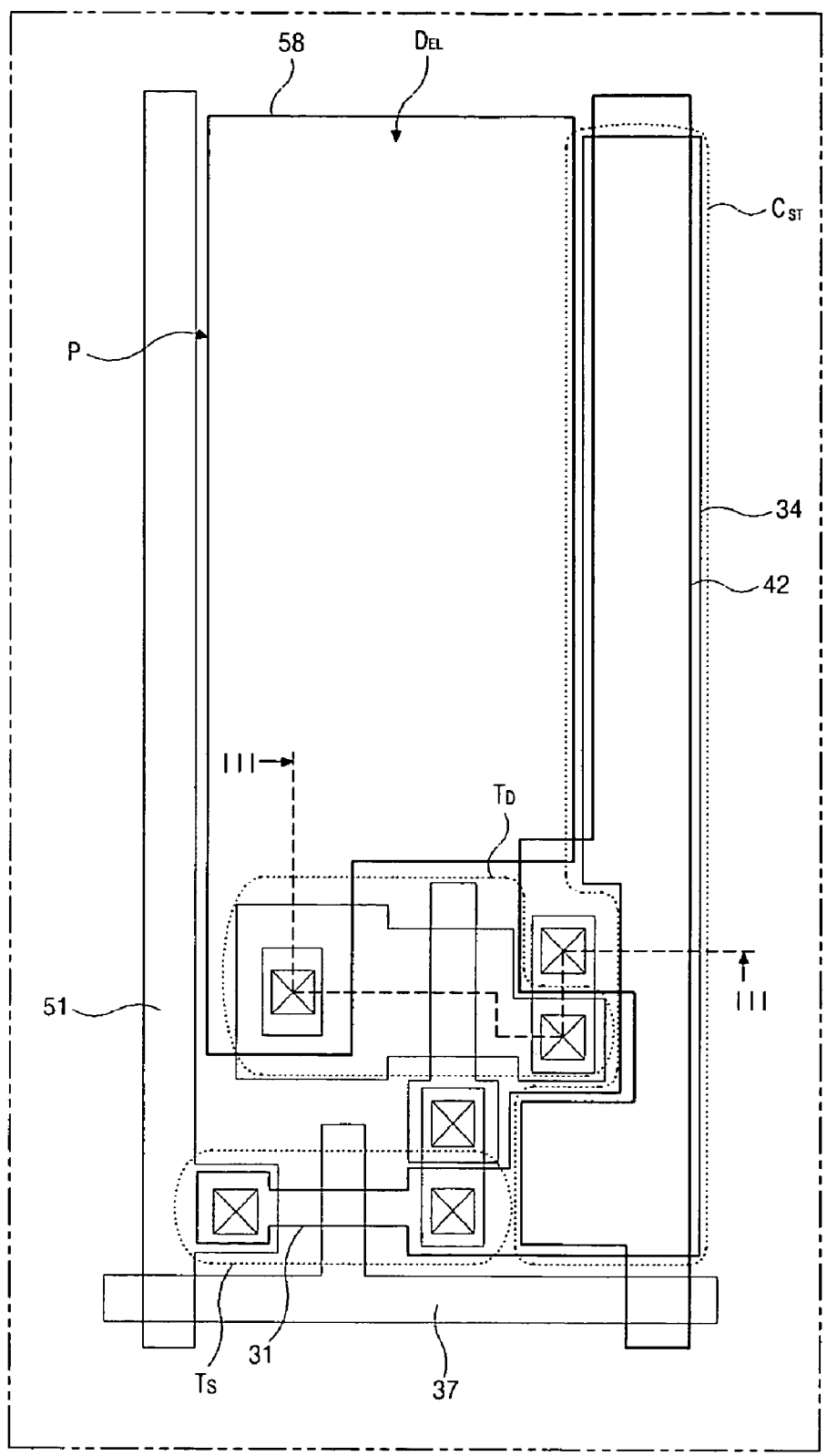
FIG. 2 is a schematic plane view of an organic electroluminescent device according to the related art.
Figure 3:
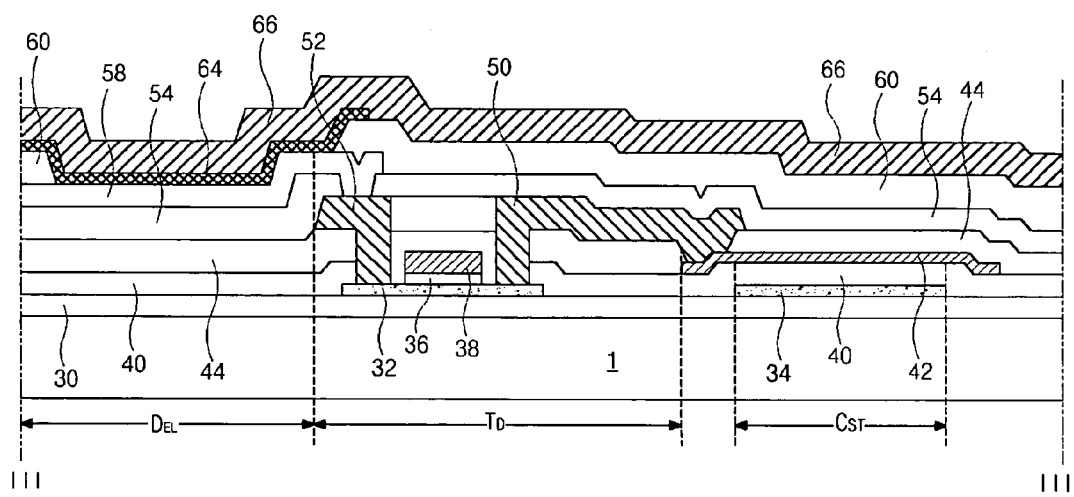
FIG. 3 is a schematic cross-sectional view taken along a line "III—III" of FIG. 2.
Figure 4A:
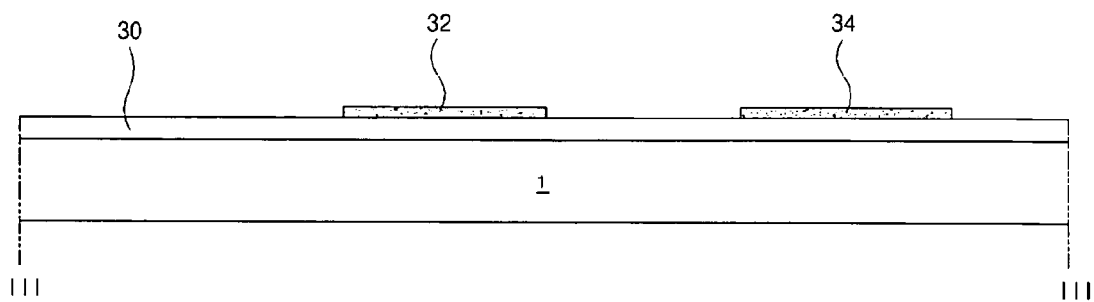
FIGS. 4A to 4I are schematic cross-sectional views showing a fabricating process of an organic electroluminescent device according to the related art.
Figure 4B:
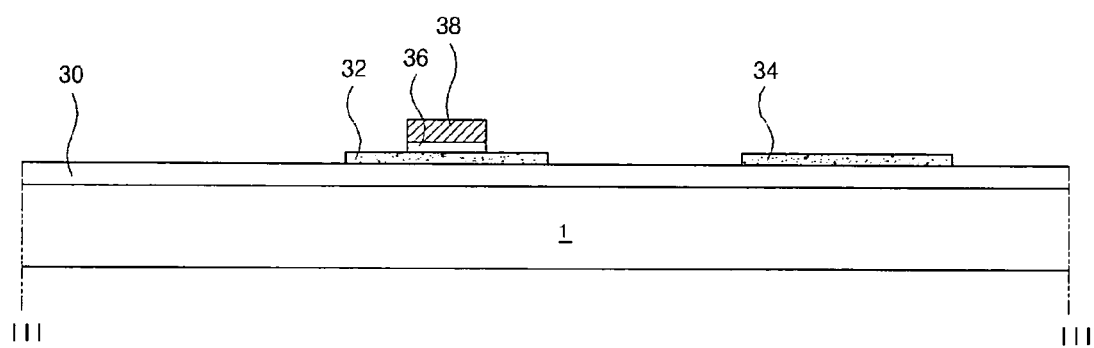
Figure 4C:
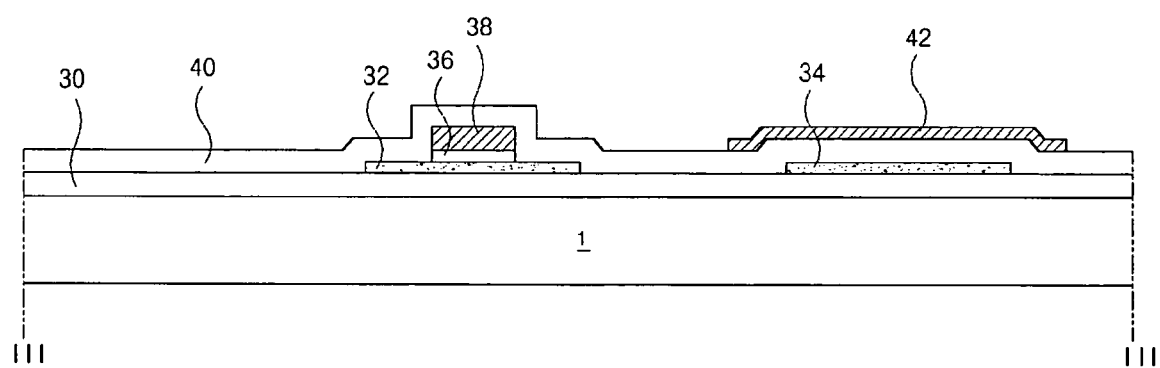
Figure 4D:
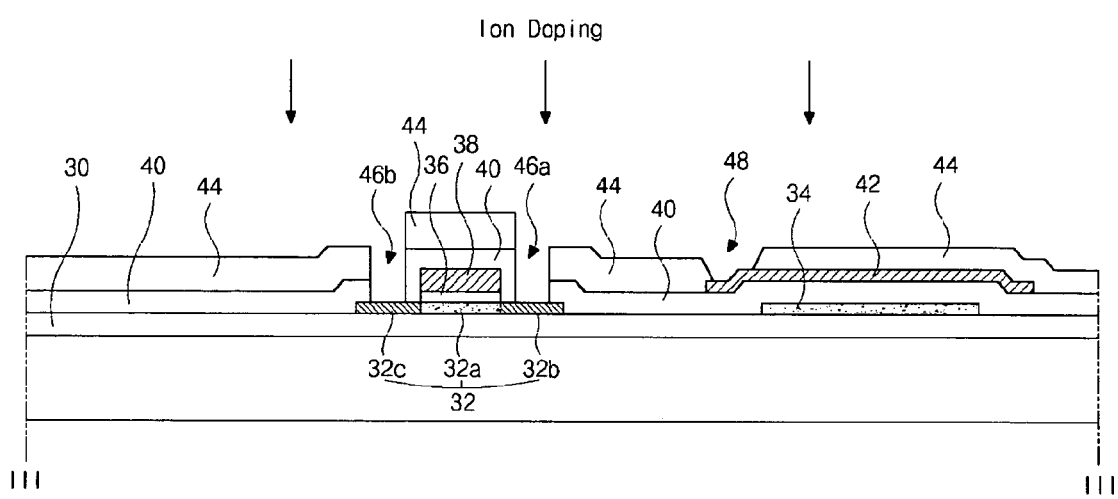
Figure 4E:
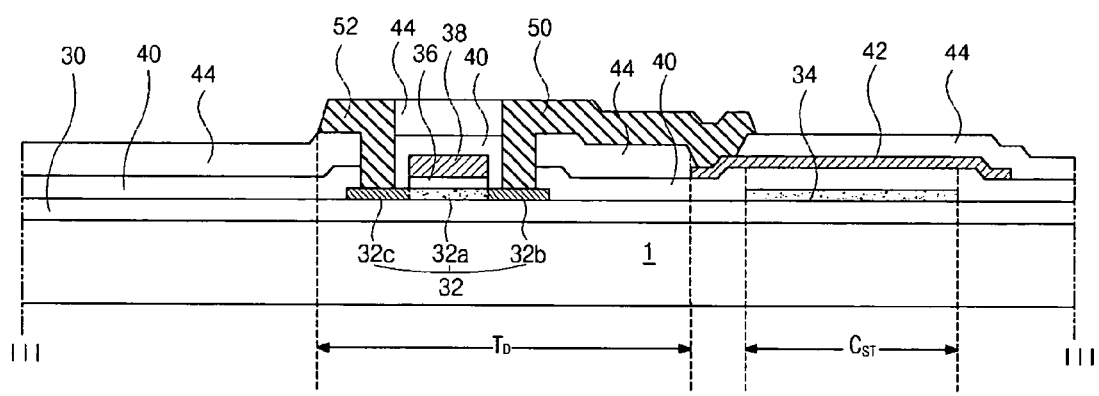
Figure 4F:
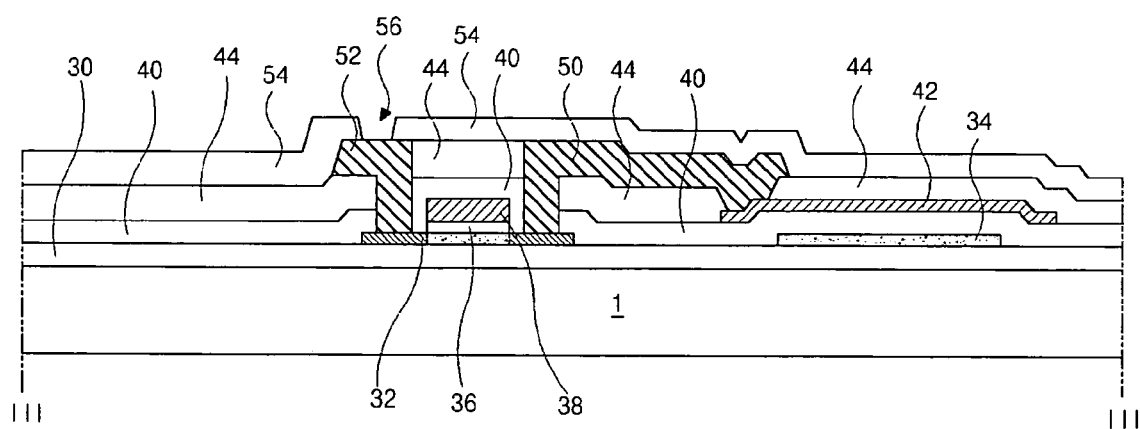
Figure 4G:
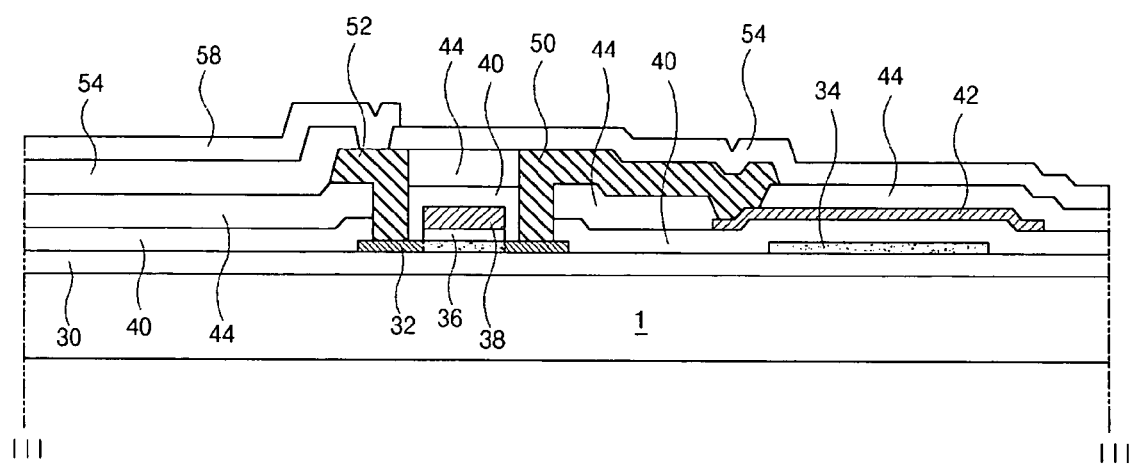
Figure 4H:
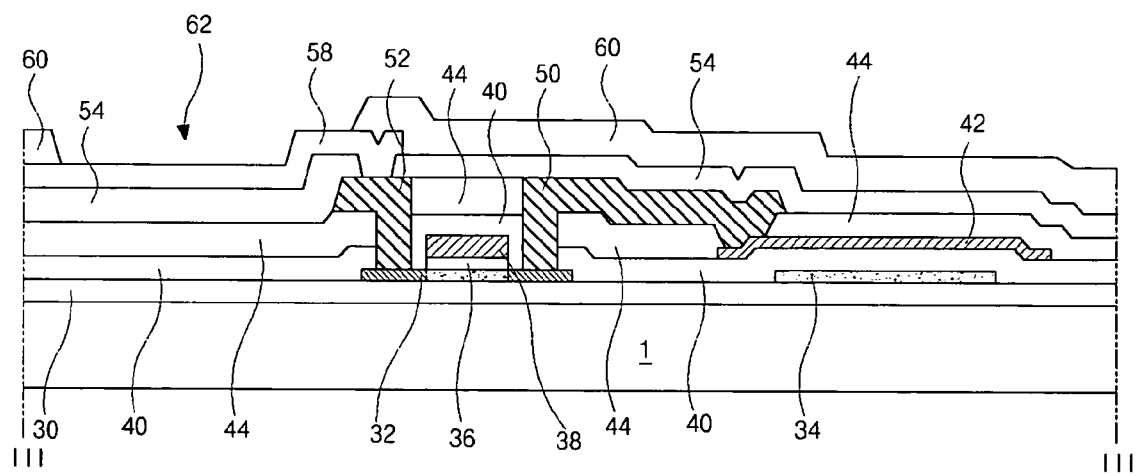
Figure 4I:
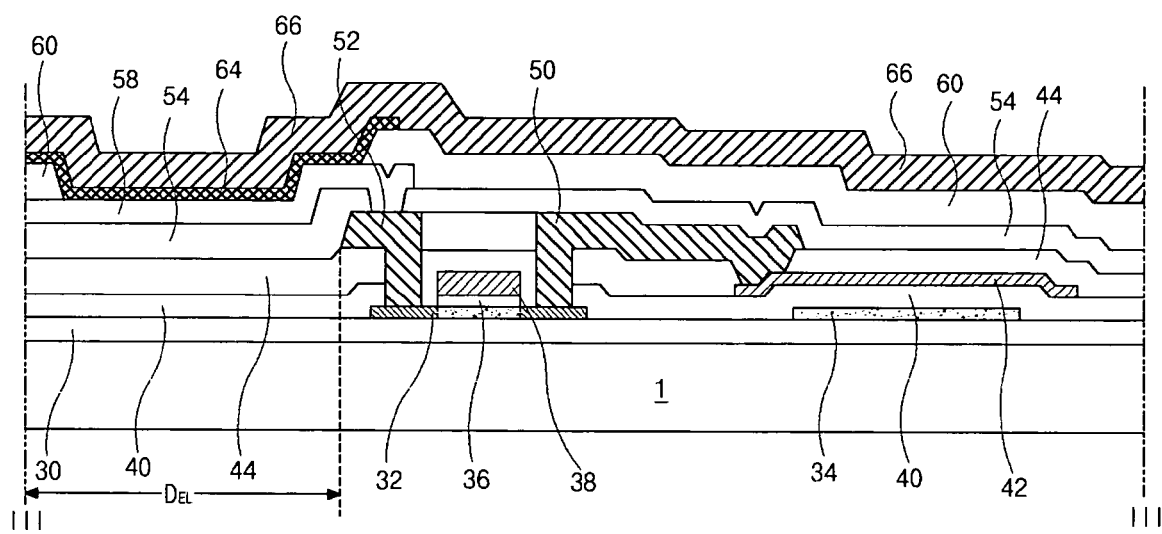
Figure 5:
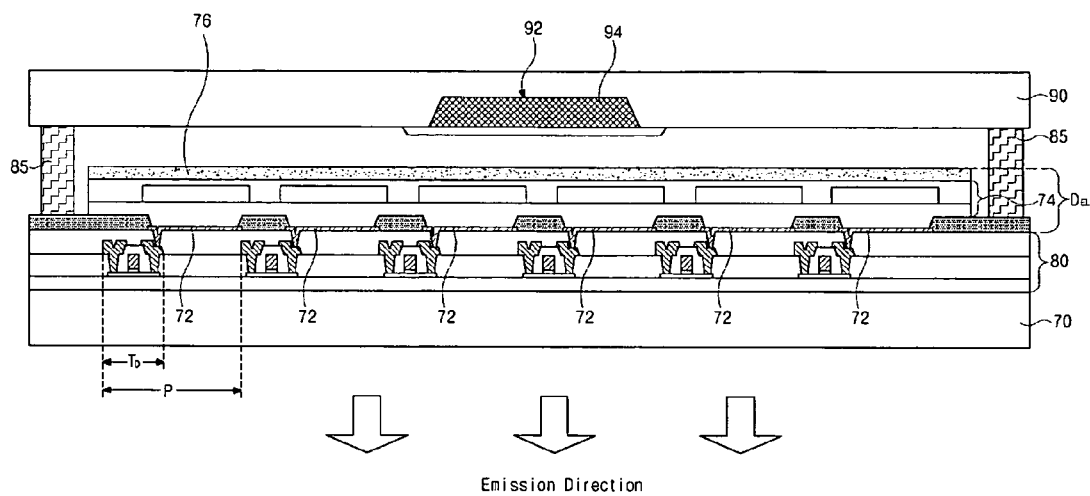
FIG. 5 is a schematic cross-sectional view of an organic electroluminescent device according to the related art.
Figure 6:
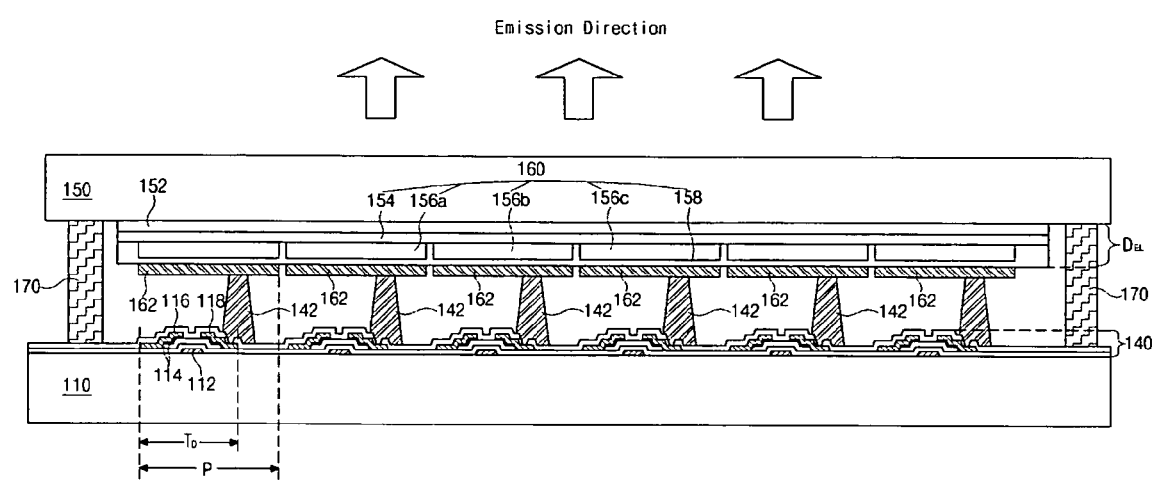
FIG. 6 is a schematic cross-sectional view of an organic electroluminescent device according to an embodiment of the present invention.

FIG. 6 is a schematic cross-sectional view of an organic electroluminescent device according to an embodiment of the present invention. In FIG. 6, first and second substrates 110 and 150, which have inner surfaces facing each other and are spaced apart from each other, have a plurality of pixel regions "P." An array layer 140 including a driving thin film transistor (TFT) "$T_D$" in each pixel region "P" is formed on an inner surface of the first substrate 110. A connection pattern 142 connected to the driving TFT "$T_D$" is formed on the array layer 140 in each pixel region "P." The connection pattern 142 can be made of a conductive material or multiple layers, including an insulating material, having sufficient thickness for connection. An additional connection electrode can be used for connecting the connection pattern 142 and the driving TFT "$T_D$." The driving TFT "$T_D$" includes a gate electrode 112, an active layer 114, and source and drain electrodes 116 and 118. The connection pattern 142 is connected to the drain electrode 118.

A first electrode 152 is formed on an inner surface of the second substrate 150. An organic electroluminescent (EL) layer 160 including red, green and blue organic emission layers 156a, 156b and 156c alternately disposed in each pixel region "P" is formed on the first electrode 152. A second electrode 162 is formed on the organic EL layer 160 in each pixel region "P." The organic EL layer 160 can be formed of a single layer or a multiple layer. In case of a multiple layer, the organic EL layer 160 may include a first carrier-transporting layer 154 on the first electrode 152, one of red, green and blue emission layers 156a, 156b and 156c on the first carrier-transporting layer 154 and a second carrier-transporting layer 158 on each of the emission layers 156a, 156b and 156c. For example, when the first and second electrodes 152 and 162 are respectively an anode and a cathode, the first carrier-transporting layer 154 corresponds to a hole-injecting layer and a hole-transporting layer, and the second carrier-transporting layer 158 corresponds to an electron-transporting layer and an electron-injecting layer. The first and second electrodes 152 and 162, and the organic EL layer 160 interposed therebetween constitute an organic EL diode "$D_{EL}$."

The first and second substrates 110 and 150 are attached with a sealant 170 at a peripheral portion thereof. Top surface of the connection pattern 142 contacts bottom surface of the second electrode 162, thereby a current of the driving TFT "$T_D$" flowing into the second electrode 162 through the connection pattern 142.

An organic EL device according to this embodiment of the present invention is a dual panel type where an array layer 140 and an organic EL diode "$D_{EL}$" are formed on respective substrates and a connection pattern 142 connects the array layer 140 and the organic EL diode "$D_{EL}$." Various modifications and variations can be made in a structure of the TFT and a connecting method of the array layer and the organic EL diode. Moreover, since the organic EL device according to the present invention is a top emission type, a thin film transistor can be easily designed, and high resolution and high aperture ratio can be obtained.

Figure 7:
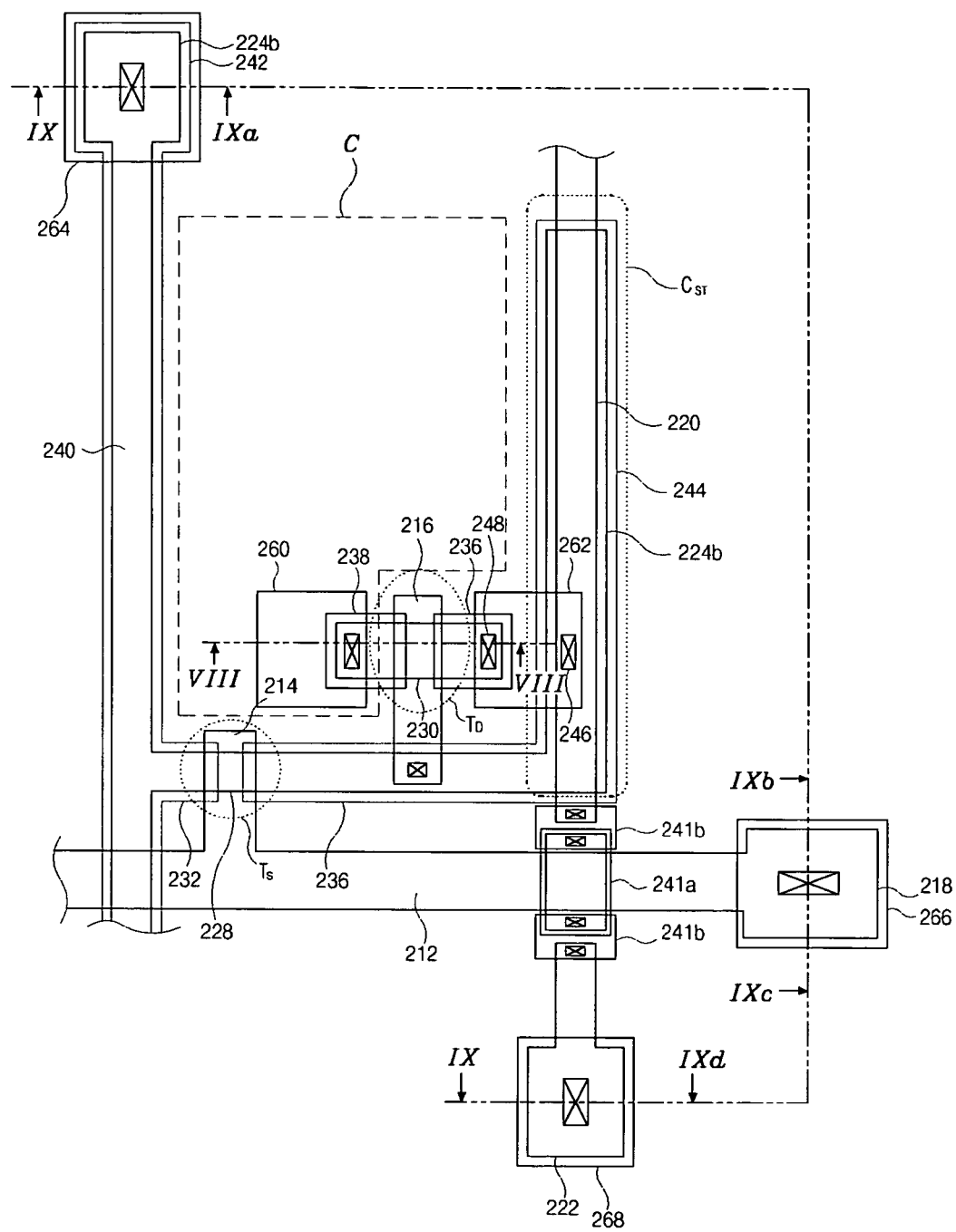
FIG. 7 is a schematic plane view of an organic electroluminescent device according to an embodiment of the present invention.

FIG. 7 is a schematic plane view of an organic electroluminescent device according to an embodiment of the present invention. In FIG. 7, a gate line 212 is formed along a first direction. A data line 240 and a power line 220 spaced apart from each other re formed along a second direction perpendicular to the first direction. A switching thin film transistor (TFT) "$T_S$" including a switching gate electrode 214, a switching active layer 228, and switching source and drain electrodes 232 and 236 is formed at a crossing of the gate line 212 and the data line 240. The switching gate electrode 214 is connected to the gate line 212 and the switching source electrode 232 is connected to the data line 240. The switching source and drain electrodes 232 and 236 are spaced apart from each other. The switching active layer 228 has a shape corresponding to the switching source and drain electrodes 232 and 236. The power line 220 may be made of the same material as the switching gate line 212 using a single fabrication process.

A driving TFT "$T_D$" includes a driving gate electrode 216, a driving active layer 230, and driving source and drain electrodes 234 and 238. The driving gate electrode 216 is connected to the switching drain electrode 236 and may be made of the same material as the gate line 212 using the same fabrication process. The driving source and drain electrodes 234 and 238 are spaced apart from each other and may be made of the same material as the data line 240 using the same fabrication process. The driving active layer 230 underlies the driving source and drain electrodes 234 and 238. A power electrode 262 is connected to the driving source electrode 234 through a source contact hole 248 and to the power line 220 through a power contact hole 246.

A connection pattern 260 is formed in a connection region "C" adjacent to the driving TFT "$T_D$" and connected to the driving drain electrode 238. The connection pattern 260 may be made of the same material as the power electrode 262 using the same fabrication process. For example, a conductive polymeric material may be used for the connection pattern 260. The connection region "C" corresponds to a second electrode (not shown) of an organic EL diode. A capacitor electrode 244 extending from the switching drain electrode 236 overlaps the power line 220 to form a storage capacitor "$C_{ST}$."

A data pad 242, a gate pad 218 and a power pad 222 are formed at one end of the data line 240, the gate line 212 and the power line 220, respectively. A data pad terminal 264, a gate pad terminal 266 and a power pad terminal 268 are formed over the data pad 242, the gate pad 218 and the power pad 222, respectively. The data pad terminal 264, the gate pad terminal 266 and the power pad terminal 268 may be made of the same material as the connection pattern 260 using the same fabrication process.

A semiconductor layer (not shown) including a doped amorphous silicon layer 224b is formed under each of the data line 240, the data pad 242 and the capacitor electrode 244. The doped amorphous silicon layer 224b may be made of the same material as an ohmic contact layer (not shown) of the switching active layer 228 and the driving active layer 230. Since the gate line 212 and the power line 220 are simultaneously formed using the same fabrication process, a first link line 241a is used as a connector of the power line 220 adjacent to the crossing of the gate line 212 and the power line 220 to prevent an electrical short between the gate line 212 and the power line 220. The first link line 241a may be made of the same material as the data line 240 using the same fabrication process. Second link lines 241b are formed at both ends of the first link line 241a and the first link line 241a is connected to the power line 220 through the second link lines 241b. The second link lines 241b may be made of the same material as the connection pattern 260 using the same fabrication process. In another embodiment, only the second link line 241b can be used for connection of the power line 220 over the gate line 212. Since different signals are applied to the data pad 242 and the power pad 222, the data pad 242 and the power pad 222 may be disposed at opposite ends of a first substrate.

FIGS. 8A to 8D are schematic cross-sectional views showing a fabricating process of a driving thin film transistor for an organic electroluminescent device according to an embodiment of the present invention, and FIGS. 9A to 9D are schematic cross-sectional views showing a fabricating process of a data pad, a gate pad and a power pad for an organic electroluminescent device according to an embodiment of the present invention. FIGS. 8A to 8D are taken along a line "VIII—VIII" of FIG. 7 and FIGS. 9A to 9D are taken along a line "IX—IX" of FIG. 7. A mask process is a photolithographic process including a photoresist (PR) patterning step using exposure and development, and an etching step using the PR pattern as a mask.

Figure 8A:
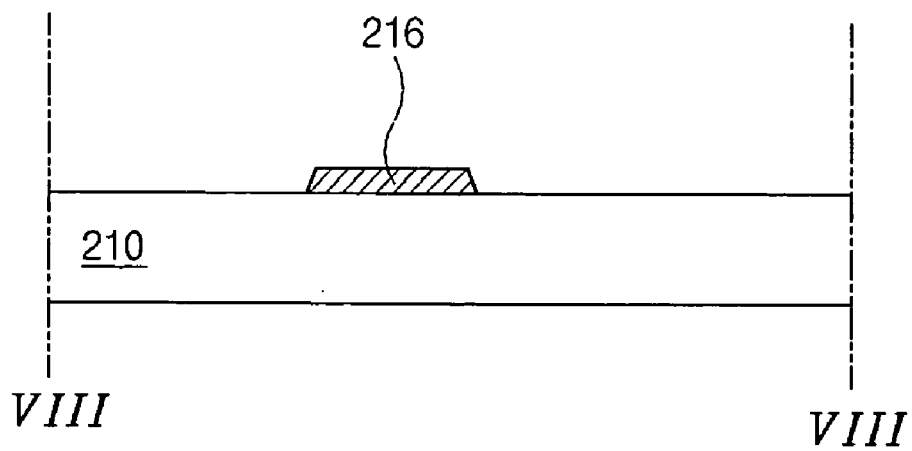
FIGS. 8A to 8D are schematic cross-sectional views showing a fabricating process of a driving thin film transistor for an organic electroluminescent device according to an embodiment of the present invention.
Figure 9A:
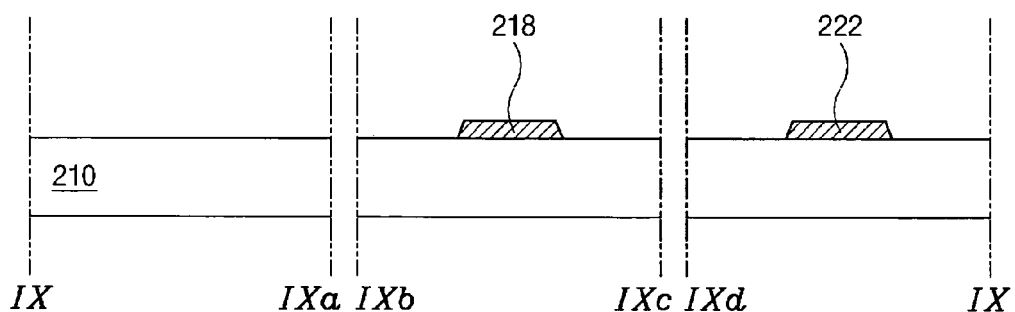
FIGS. 9A to 9D are schematic cross-sectional views showing a fabricating process of a data pad, a gate pad and a power pad for an organic electroluminescent device according to an embodiment of the present invention.

In FIGS. 8A and 9A, a driving gate electrode 216, a gate pad 218 and a power pad 222 of a first metallic material are formed on a first substrate 210 using a first mask process. Even though not shown in FIGS. 8A and 9A, a power line connected to the power pad 222 is formed at the same time.

The first metallic material has low resistivity. For example, aluminum (Al) or aluminum (Al) alloy can be used as the first metallic material.

Figure 8B:
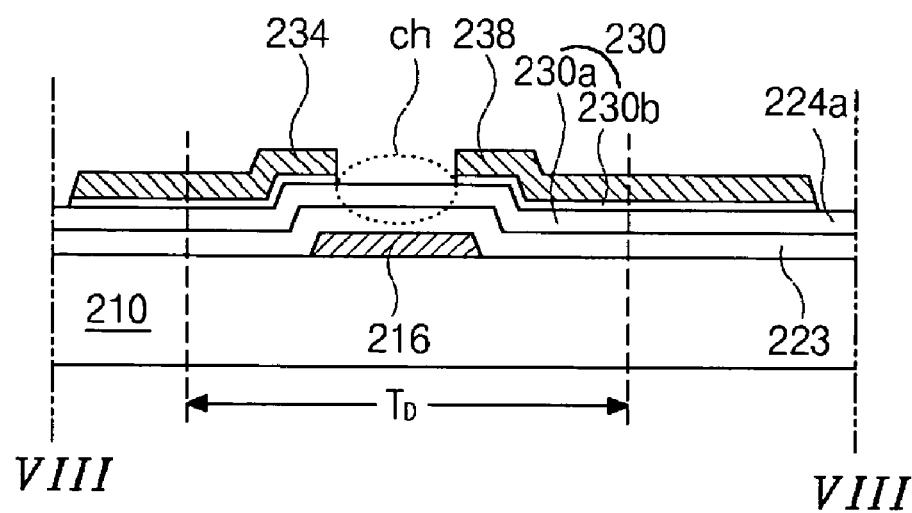
Figure 9B:
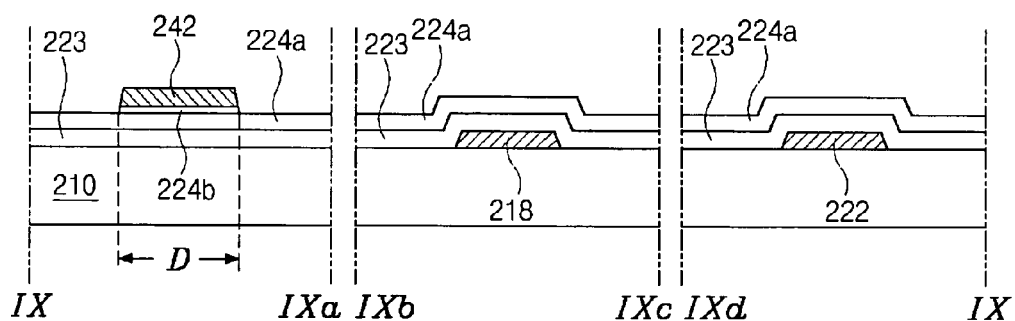

In FIGS. 8B and 9B, a first insulating layer (a gate insulating layer) 223 of a first insulating material and an amorphous silicon (a-Si:H) layer 224a are sequentially formed on the driving gate electrode 216, the gate pad 218 and the power pad 222. After sequentially depositing a doped silicon material and a second metallic material on the amorphous silicon layer 224a, an ohmic contact layer 230b, source and drain electrodes 234 and 238, and a data pad 242 are formed using a second mask process. The amorphous silicon layer 224a includes an active portion 230a corresponding to the driving gate electrode 216. The active portion 230a of the amorphous silicon layer 224a and the ohmic contact layer 230b constitute a driving active layer 230. The source and drain electrodes 234 and 238 are spaced apart from each other and an exposed active portion 230a becomes a channel region "ch." The data pad 242 is formed in a data pad region "D." A data line (not shown) is simultaneously formed with the data pad 242 and the data pad region "D" is disposed at one end of the data line. The data pad 242 and the power pad 222 may be formed at opposite ends of the first substrate 210.

The driving gate electrode 216, the driving active layer 230, and source and drain electrodes 234 and 238 constitute a driving thin film transistor (TFT) "$T_D$." A doped amorphous silicon layer 224b is formed under the data pad 242. The doped amorphous silicon layer 224b may be made of the same material as the ohmic contact layer 230b of the driving active layer 230 and has a shape corresponding to the data pad 242. The first insulating material is a silicon insulating material, such as silicon nitride ($SiN_x$) or silicon oxide ($SiO_2$). The second metallic material is a chemically resistive material, such as molybdenum (Mo), titanium (Ti), chromium (Cr) and tungsten (W), for example.

Figure 8C:
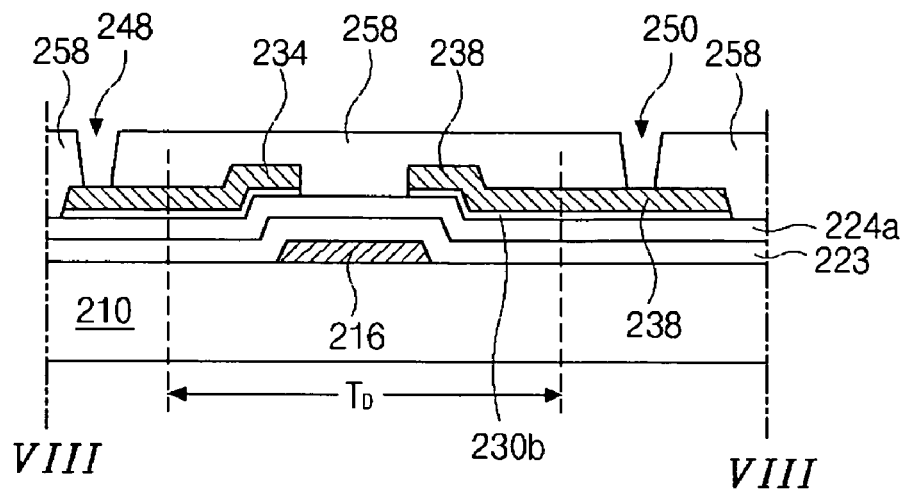
Figure 9C:
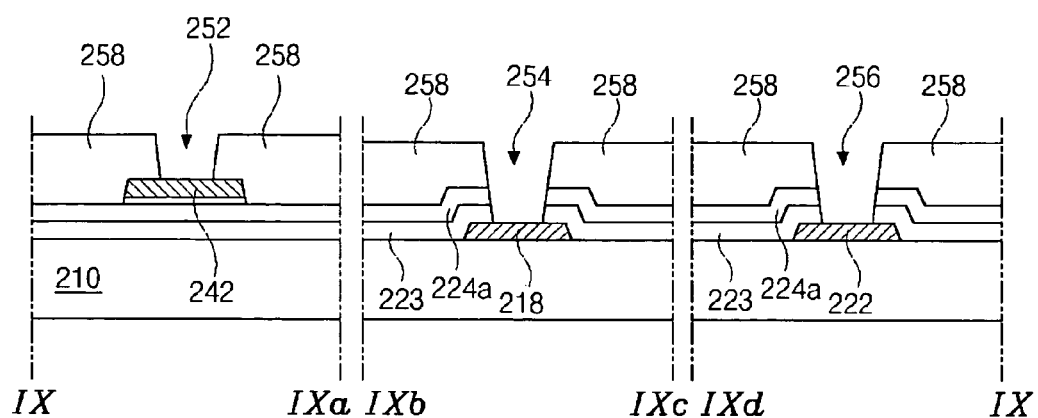

In FIGS. 8C and 9C, after depositing a second insulating material on the driving TFT "$T_D$," the data pad 242, the gate pad 218 and the power pad 222, a second insulating layer (a passivation layer) 258 having source and drain contact holes 248 and 250, a data pad contact hole 252, a gate pad contact hole 254 and a power pad contact hole 256 is formed through a third mask process. The source and drain contact holes 248 and 250 expose the source and drain electrodes 234 and 238, respectively. The data pad contact hole 252, the gate pad contact hole 254 and the power pad contact hole 256 expose the data pad 242, the gate pad 218 and the power pad 222, respectively. The gate pad contact hole 254 and the power pad contact hole 256 are formed through the first insulating layer 223, the amorphous silicon layer 224a and the second insulating layer 258. The drain contact hole 250 is disposed in a connection region "C" (of FIG. 7) corresponding to a second electrode of an organic electroluminescent diode.

Figure 8D:
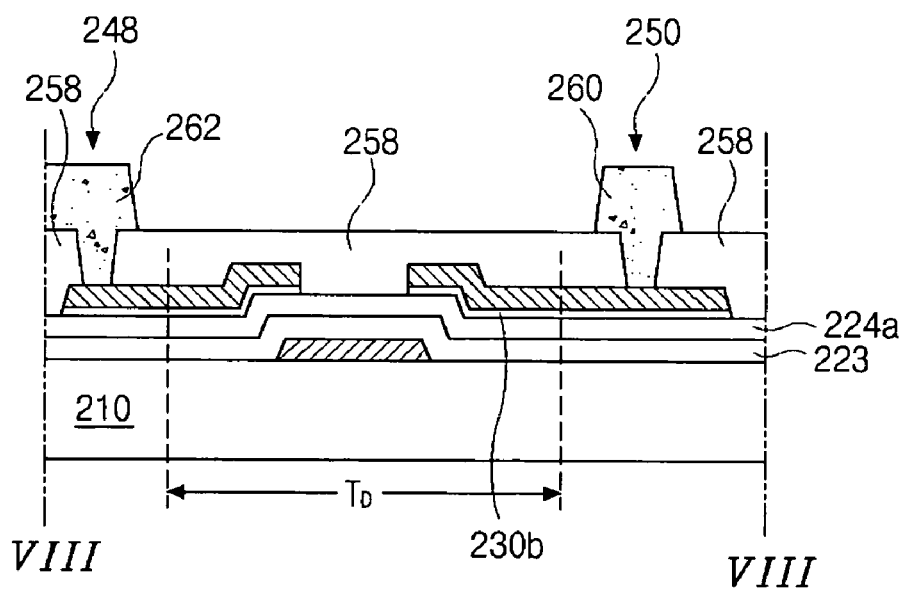
Figure 9D:
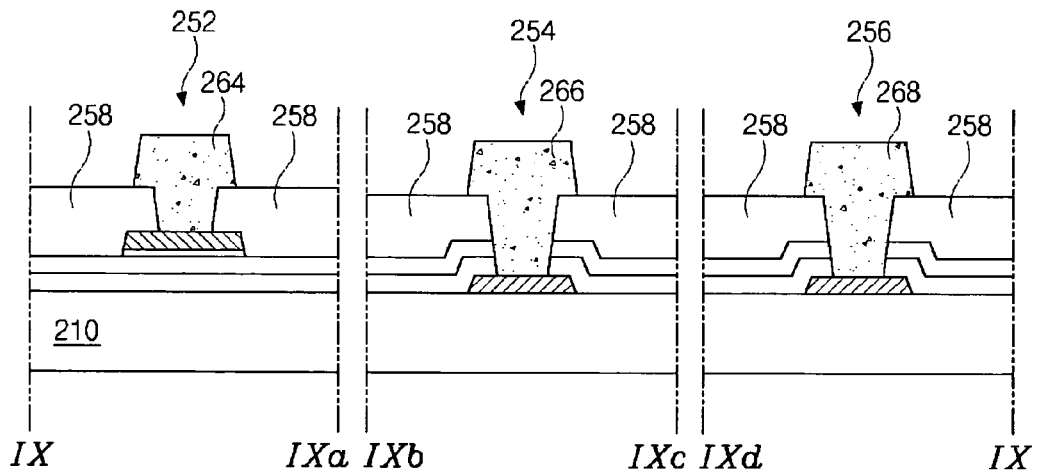

In FIGS. 8D and 9D, after depositing a conductive polymeric material on the second insulating layer 258, a connection pattern 260, a power electrode 262, a data pad terminal 264, a gate pad terminal 266 and a power pad terminal 268 are formed using a fourth mask process. The connection pattern 260 is connected to the drain electrode 238 through the drain contact hole 250 and the power electrode 262 is connected to the source electrode 234 through the source contact hole 248. The data pad terminal 264 is connected to the data pad 242 through the data pad contact hole 252, the gate pad terminal 266 is connected to the gate pad 218 through the gate pad contact hole 254, and the power pad terminal 268 is connected to the power pad 222 through the power pad contact hole 256.

An organic electroluminescent device of the present invention has some advantages. First, since an inverted staggered thin film transistor of amorphous silicon is used, the organic ELD can be fabricated using a low temperature process. Second, since a number of mask processes can be reduced even when an additional connection pattern is added, production yield can be effectively improved because the process is simplified. Third, since array patterns and an organic EL diode are formed on the respective substrate, production yield and production management efficiency are improved, and lifetime of an organic EL device is lengthened. Fourth, since the ELD is a top emission type, a thin film transistor can be easily designed, and high resolution and high aperture ratio can be obtained regardless of lower array patterns.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   first and second substrates facing and spaced apart from each other;
   a gate line on an inner surface of the first substrate;
   a semiconductor layer over the gate line, the semiconductor layer overlying a surface of the first substrate;
   a data line crossing the gate line;
   a data ohmic contact layer under the data line, the data ohmic contact layer having the same shape as the data line;
   a power line parallel to, or substantially parallel to, and spaced apart from the data line, the power line including the same material as the gate line;
   a switching thin film transistor connected to the gate line and the data line, the switching thin film transistor using the semiconductor layer as a switching active layer;
   a driving thin film transistor connected to the switching thin film transistor and the power line, the driving thin film transistor using the semiconductor layer as a driving active layer;
   a connection pattern connected to the driving thin film transistor, the connection pattern including a conductive polymeric material;
   a first electrode on an inner surface of the second substrate;
   an organic electroluminescent layer on the first electrode; and
   a second electrode on the organic electroluminescent layer, the second electrode contacting the connection pattern.

2. The device according to claim 1, wherein the data line and the data ohmic contact layer are sequentially patterned in a single photolithographic process.

3. The device according to claim 1, further comprising a first link line adjacent to a crossing of the gate line and the power line, wherein the first link line includes the same material as the connection pattern.

4. The device according to claim 1, further comprising first and second link lines adjacent to a crossing of the gate line and the power line, wherein the first link line includes the same material as the connection pattern and the second link line includes the same material as the data line, wherein the second link line crosses the gate line and the first link line is disposed at both ends of the second link line.

5. The device according to claim 1, further comprising a gate pad at one end of the gate line, a data pad at one end of the data line and a power pad at one end of the power line.

6. The device according to claim 5, wherein the switching thin film transistor includes a switching gate electrode connected to the gate line, the switching active layer over the switching gate electrode, a switching ohmic contact layer on the switching active layer, and switching source and drain electrodes on the switching ohmic contact layer.

7. The device according to claim 6, wherein the driving thin film transistor includes a driving gate electrode connected to the switching drain electrode, the driving active layer over the driving gate electrode, a driving ohmic contact layer on the driving active layer, and driving source and drain electrodes on the driving ohmic contact layer.

8. The device according to claim 7, further comprising a gate insulating layer between the driving gate electrode and the driving active layer and a passivation layer on the driving thin film transistor, wherein the passivation layer includes a source contact hole exposing the driving source electrode, a drain contact hole exposing the driving drain electrode, a gate pad contact hole exposing the gate pad, a data pad contact hole exposing the data pad and a power pad contact hole exposing the power pad.

9. The device according to claim 8, wherein the passivation layer includes the gate pad contact hole and the power pad contact hole through the semiconductor layer and the gate insulating layer.

10. The device according to claim 9, further comprising a gate pad terminal and a power pad terminal on the passivation layer, wherein the gate pad terminal is connected to the gate pad through the gate pad contact hole and the power pad terminal is connected to the power pad through the power pad contact hole, wherein the gate pad terminal and the power pad terminal include the same material as the connection pattern.

11. The device according to claim 8, further comprising a connection electrode connected to the driving source electrode through the source contact hole and to the power line.

12. The device according to claim 1, wherein the semiconductor layer is formed of amorphous silicon.

13. The device according to claim 1, wherein the data ohmic contact layer is formed of doped amorphous silicon.

14. The device according to claim 6, wherein the switching ohmic contact layer is formed of doped amorphous silicon.

15. The device according to claim 7, wherein the driving ohmic contact layer is formed of doped amorphous silicon.

* * * * *